United States Patent [19]
Kitaguchi et al.

[11] Patent Number: 5,453,993
[45] Date of Patent: Sep. 26, 1995

[54] SEMICONDUCTOR INTEGRATED CIRCUIT WITH CLOCK SELECTING FUNCTION

[75] Inventors: Akira Kitaguchi; Masaharu Taniguchi, both of Itami, Japan

[73] Assignee: Mitsubishi Denki Kabushiki Kaisha, Tokyo, Japan

[21] Appl. No.: 186,107

[22] Filed: Jan. 25, 1994

[30] Foreign Application Priority Data

Feb. 16, 1993 [JP] Japan .................... 5-026613

[51] Int. Cl.⁶ ........................ G06F 11/00; G01R 31/28
[52] U.S. Cl. ........................ 371/22.5; 324/73.1
[58] Field of Search ............... 371/22.5, 22.1, 371/25.1, 27, 22.6; 324/158 R, 73.1, 612

[56] References Cited

U.S. PATENT DOCUMENTS

| | | | |
|---|---|---|---|
| T924,006 | 7/1974 | Chia et al. | 371/22.1 |
| 3,931,506 | 1/1976 | Borelli et al. | 371/22.1 |
| 4,070,565 | 1/1978 | Borelli | 371/22.6 |
| 4,139,147 | 2/1979 | Franke | 371/25.1 |
| 4,896,095 | 1/1990 | Schultz | 324/612 |
| 4,901,315 | 2/1990 | Heaps | 371/27 |
| 4,929,889 | 5/1990 | Seiler et al. | 371/25.1 |
| 5,012,180 | 4/1991 | Dalrymple et al. | 324/73.1 |
| 5,095,483 | 3/1992 | Dubler et al. | 371/25.1 |
| 5,130,646 | 7/1992 | Kojima | 324/73.1 |
| 5,198,759 | 3/1993 | Ohnesorge | 324/158 R |

*Primary Examiner*—Emanuel T. Voeltz
*Assistant Examiner*—Alan Tran
*Attorney, Agent, or Firm*—Oblon, Spivak, McClelland, Maier & Neustadt

[57] ABSTRACT

Disclosed is a semiconductor integrated circuit which can be tested with a high-speed clock of actual operation level or more, even if a relatively low-priced IC tester which is not capable of supplying high-speed clocks is employed, and a method of testing the same. An exclusive OR gate (2) of the semiconductor integrated circuit receives the first test clock (TCLK1) through the first test clock input pin (P1) into the first input and the second test clock (TCLK2) through the second test clock input pin (P2) into the second input, to output a high-speed clock (SCLK) resulting from the test clocks to an A input of a selector (3). Thus, the semiconductor interacted circuit internally generates the high-speed clock having higher frequency than that of the test clock to operate an internal circuit, thereby being tested with clock frequency of actual operation level or more even by means of the relatively low-priced IC tester.

8 Claims, 10 Drawing Sheets

F I G. 3A
TCLK1

F I G. 3B
TCLK2

F I G. 3C
SCLK

F I G. 3D

| DELAY B | A/4 | FREQUENCY | 2 f | duty | 25% |

FIG. 4A
TCLK1
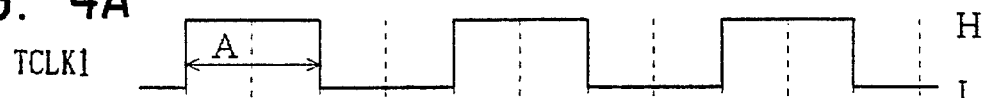
FIG. 4B
TCLK2
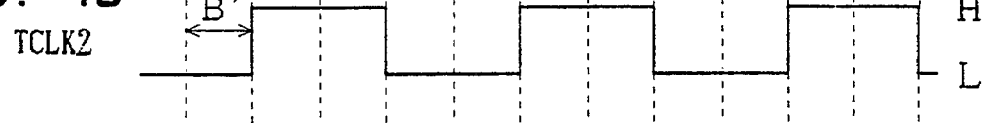
FIG. 4C
SCLK1
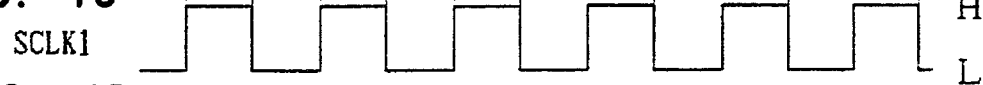
FIG. 4D
| DELAY B' | A/2 | FREQUENCY | 2f | duty | 50% |

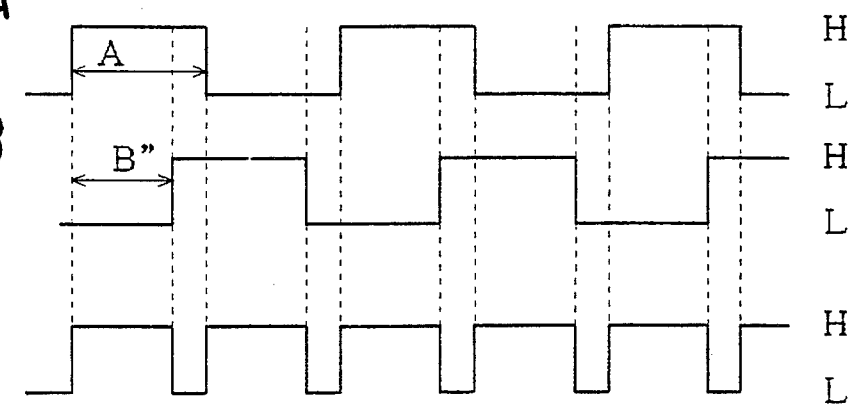

FIG. 6A
TCLK1
FIG. 6B
TCLK2
FIG. 6C
SCLK
FIG. 6D
DO
FIRST
STROBE POINT
FIG. 6E
OUTPUT
EXPECTATION
WAVEFORM
FIG. 6F
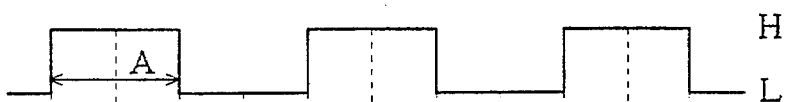
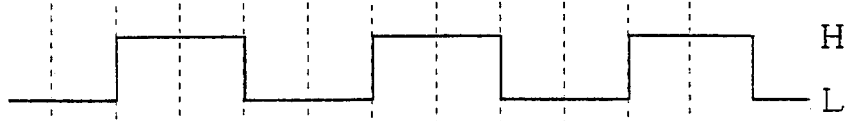
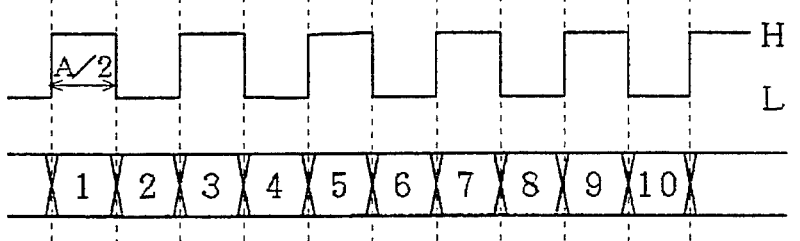
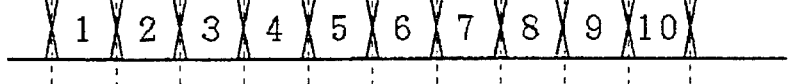
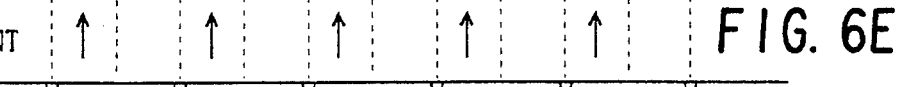
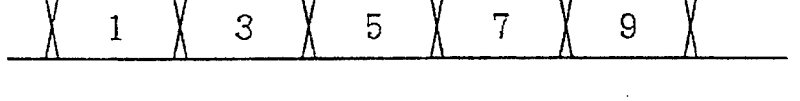

FIG. 7A
TCLK1
FIG. 7B
TCLK2
FIG. 7C
SCLK
FIG. 7D
DO
SECOND STROBE POINT
FIG. 7E
OUTPUT EXPECTATION WAVEFORM 1
FIG. 7F
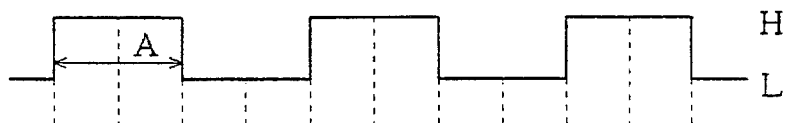
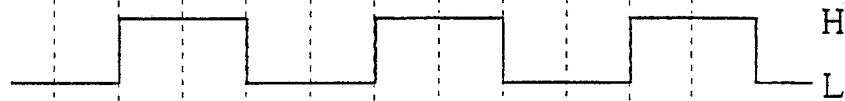
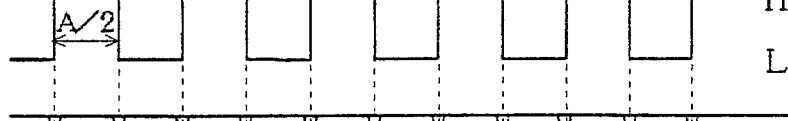
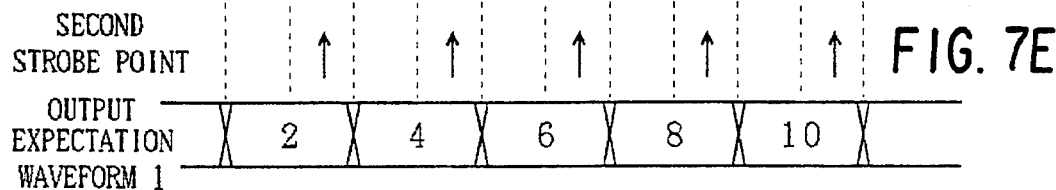

FIG. 8A TCLK1

FIG. 8B TCLK2

FIG. 8C SCLK1

FIG. 8D OUTPUT

STROBE AT P15A

STROBE AT P15B

EXPECTATION WAVEFORM OF P15A

EXPECTATION WAVEFORM OF P15B

SEMICONDUCTOR INTEGRATED CIRCUIT WITH CLOCK SELECTING FUNCTION

BACKGROUND OF THE INVENTION

1. Field of the Invention

The present invention relates to a semiconductor integrated circuit processed to be easily tested, and a method of testing the same.

2. Description of the Background Art

In conventional arts, a crystal oscillator, a ceramic oscillator, CR oscillator and the like has been used as a clock generator of an IC tester for testing a semiconductor integrated circuit (IC). Employing a clock just generated by the clock generator as a clock of the IC to be tested (DUT; Device Under Test), an operation test of the DUT has been performed.

A burn-in is one of the methods of operation test of the IC. In practicing a burn-in, in order to reject structural defects of the IC (e.g. defects of a gate oxide film in a MOS structure) in an early stage, stress should be applied to the IC under severer condition (higher temperature, higher voltage) than that in actual operation. The stress is several hundreds to several tens times as much as that in actual operation. There are two types of burn-ins, i.e., a static burn-in and a dynamic burn-in. In the static burn-in, the stress is applied to the IC without operation, while in the dynamic burn-in, the stress is applied to all of the internal elements of the circuit with the IC in operation. Following the burn-in, a normal functional test is given to the IC, thereby checking if the IC can normally operate, and further an acceleration test may be given thereto.

In recent, with refinement of process rule and enlargement in scale of incorporated circuit, the dynamic burn-in is becoming a leading mainstream. Since a purpose of the dynamic burn-in lies in performing the acceleration test, it is necessary to conduct the test under severer condition than that in actual operation. With speed up of an operating clock of an LSI, the clock generator of an IC driving device which conducts the dynamic burn-in is required to supply a clock higher than that in actual operation of the LSI.

In the conventional clock generator using the crystal oscillator and the like, however, it is so difficult to generate a high-frequency clock which is capable of answering the high-speed operation of the IC that the clock generator which can generate the high-frequency clock is highly priced.

Thus, since it is impossible to achieve the clock generator of the IC tester which is capable of answering the high-speed operation of the IC at a low cost, there arises a problem that the functional test or such a test as burn-in of the IC can not be performed by means of a relatively low-priced IC tester with the high-frequency clock which is capable of answering the high-speed operation of the IC.

SUMMARY OF THE INVENTION

According to the first aspect of the present invention, a semiconductor integrated circuit comprises: first to n-th (integer $n \geq 2$) test clock input terminals for receiving first to n-th test clocks respectively which have the same test frequency and test waveform and different test phases; a normal clock input terminal for receiving a normal clock; a test mode input terminal for receiving a test mode signal; a data input terminal for receiving input data; a data output terminal; a high-frequency conversion means for receiving the first to n-th test clocks obtained through the first to n-th test clock input terminals into first to n-th inputs respectively, to output a high-speed clock having higher frequency than the test frequency as a function of each of phase differences of the first to n-th test clocks; a selection means for receiving the high-speed clock into a first input, receiving the a normal clock obtained through the normal clock input terminal into a second input and receiving the test mode signal into a third input, to output either the high-speed clock or the normal clock as a selected clock according to the test mode signal; and an internal circuit for receiving the selected clock and the input data obtained through the data input terminal and then operating with the selected clock used as an operating clock to output output data to the outside through the data output terminal.

Preferably, in the semiconductor integrated circuit, the integer n is 2; the first and second (n=2) test clocks are signals each consisting of H-level and L-level and having the same duty; and the high-frequency conversion means comprises an exclusive OR gate whose first input is connected to the first test clock input terminal and second input is connected to the second test clock input terminal.

Preferably, in the semiconductor integrated circuit, the integer n is 4; the first to n-th (n=4) test clocks are signals each of which consists of H-level and L-level and has the same duty, in which a phase difference between the first test clock and the second test clock is the same as a phase difference between the third test clock and the fourth test clock; the high-frequency conversion means comprises a first exclusive OR gate whose first input is connected to the first test clock input terminal and second input is connected to the second test clock input terminal; a second exclusive OR gate whose first input is connected to the third test clock input terminal and fourth input is connected to the fourth test clock input terminal; a third exclusive OR gate whose first input is connected to an output of the first exclusive OR gate and second input is connected to an output of the second exclusive OR gate.

In the semiconductor integrated circuit in accordance with the first aspect of the present invention, the high-frequency conversion means outputs the high-speed clock having higher frequency than the test frequency as a function of the respective phase differences of the first to n-th test clocks. The selection means outputs the high-speed clock as a selected clock which serves as an operating clock according to the test mode signal.

Thus, the internal circuit can operate with the high-speed clock having higher frequency than the test frequency of the first to n-th test clocks used as an operating clock.

The present invention is also directed a method of testing a semiconductor integrated circuit by means of an IC tester. According to the second aspect of the present invention, in the method, the semiconductor integrated circuit comprises: first to n-th (integer $n \geq 2$) test clock input terminals for receiving first to n-th test clocks respectively which have the same test frequency and test waveform and different test phases; a normal clock input terminal for receiving a normal clock; a test mode input terminal for receiving a test mode signal; a data input terminal for receiving input data; a data output terminal; a high-frequency conversion means for receiving the first to n-th test clocks obtained through the first to n-th test clock input terminals into first to n-th inputs respectively, to output a high-speed clock having higher frequency than the test frequency as a function of each of phase differences of the first to n-th test clocks; a selection means for receiving the high-speed clock into a first input, receiving the a normal clock obtained through the normal clock input terminal into a second input and receiving the test mode signal into a third input, to output either the high-speed clock or the normal clock as a selected clock according to the test mode signal; and an internal circuit for receiving the selected clock and the input data obtained through the data input terminal and then operating with the selected clock used as an operating clock to output output data to the outside through the data output terminal, wherein the IC tester comprises: first to n-th clock output terminals for outputting the first to n-th test clocks having the same frequency and waveform and different phases; a test mode output terminal for outputting the test mode signal; a test data output terminal for outputting the input data; and a test data input terminal for inputting the output data, and wherein the IC tester is capable of performing an operation test by judging the logical level of the output data, the method comprising the steps of: (a) connecting the semiconductor integrated circuit and the IC tester through connections between the first to n-th test clock input terminals and the first to n-th clock output terminals respectively, between the test mode input terminal and the test mode output terminal, between the data input terminal and the test data output terminal and between the data output terminal and the test data input terminal; (b) outputting the test mode signal indicating selection of the high-speed clock from the IC tester; (c) outputting the first to n-th test clocks from the IC tester; and (d) performing an operation test of the semiconductor integrated circuit by outputting the input data from the IC tester in sequence and then judging the signal level of the output data obtained from the semiconductor interacted circuit.

Preferably, in the method, the integer n is 2; the first and second (n=2) test clocks are signals each consisting of H-level and L-level and having the same duty; and the high-frequency conversion means comprises an exclusive OR gate whose first input is connected to the first test clock input terminal and second input is connected to the second test clock input terminal.

Preferably, in the method, the semiconductor integrated circuit has variation of the output data in response to every change of edges of the high-speed clock; the IC tester judges the signal level of the output data every half cycle of the first and second test clocks; and in the method a first test is performed by carrying out the steps of (b) to (d) after setting the judgement timing of the output data in one of an H-level period and an L-level period of the high-speed clock; and a second test is performed by carrying out the steps of (b) to (d) after setting the judgement timing of the output data in the other period of the high-speed clock.

Preferably, in the method, the semiconductor integrated circuit has variation of the output data in response to every change of edges of the high-speed clock, the IC tester judges the signal level of the output data every half cycle of the first and second test clocks, the step (a) comprises the step of connecting first and second test data input terminals to the data output terminal in common, and the method further comprises the step of setting the judgement timing of the output data received by the first test data terminal in one of an H-level period and an L-level period of the high-speed clock while setting the judgement timing of the output data received by the second test data terminal in the other period of the high-speed clock, prior to performing the steps (b) to (d).

In the method of testing the semiconductor integrated circuit in accordance with the second aspect of the present invention, the test mode signal indicating the selection of the high-speed clock is outputted from the IC tester in the step (b) and the first to n-th test clocks are outputted from the IC tester in the step (c), whereby a test of the semiconductor integrated circuit according to the present invention can be carried out with the semiconductor integrated circuit in operation with the high-speed clock having higher frequency than the test frequency.

Thus, also in the case of operation of the semiconductor integrated circuit with the clock higher than the test clock of the IC tester, it is possible to perform a test of the semiconductor integrated circuit by supplying an actual operating clock.

According to the third aspect of the present invention, in a method of testing a semiconductor integrated circuit driven by an IC driving means, the semiconductor integrated circuit comprises first to n-th (integer n≧2) test dock input terminals for receiving first to n-th test clocks respectively which have the same test frequency and test waveform and different test phases; a normal clock input terminal for receiving a normal clock; a test mode input terminal for receiving a test mode signal; a data input terminal for receiving input data; a data output terminal; a high-frequency conversion means for receiving the first to n-th test clocks obtained through the first to n-th test clock input terminals into first to n-th inputs respectively, to output a high-speed clock having higher frequency than the test frequency as a function of each of phase differences of the first to n-th test clocks; a selection means for receiving the high-speed clock into a first input, receiving the a normal clock obtained through the normal clock input terminal into a second input and receiving the test mode signal into a third input, to output either the high-speed clock or the normal clock as a selected clock according to the test mode signal; and an internal circuit for receiving the selected clock and the input data obtained through the data input terminal and then operating with the selected clock used as an operating clock to output output data to the outside through the data output terminal, and wherein the IC driving means comprises first to n-th clock output terminals for outputting the first to n-th test clocks having the same frequency and waveform and different phases; a test mode output terminal for outputting the test mode signal; and a test data output terminal for outputting the input data, and the method comprising the steps of: (a) connecting the semiconductor integrated circuit and the IC tester through connections between the first to n-th test clock input terminals and the first to n-th clock output terminals respectively, between the test mode input terminal and the test mode output terminal, and between the data input terminal and the test data output terminal; (b) outputting the test mode signal indicating selection of the high-speed clock from the IC driving means; (c) outputting the first to n-th test clocks from the IC driving means; and (d) outputting the input data in sequence from the IC driving means, and wherein the steps of (b) to (d) are carried out under severer condition than that in actual operation of the semiconductor integrated circuit.

In the method of testing the semiconductor integrated circuit in accordance with the third aspect of the present invention, the test mode signal indicating the selection of the high-speed clock is outputted from the IC tester in the step (b) and the first to n-th test clocks are outputted from the IC tester in the step (c), whereby a test of the semiconductor integrated circuit according to the present invention can be carried out with the semiconductor integrated circuit in operation with the high-speed clock having higher frequency than the test frequency under severer condition than that in actual operation.

Thus, also in the case of operation of the semiconductor integrated circuit with the clock higher than the test clock of the IC tester, it is possible to perform a test of the semiconductor integrated circuit such as a burn-in by supplying a clock of actual operation level or more under severer condition than that in actual operation.

Accordingly, an object of the present invention is to achieve a semiconductor integrated circuit which can be tested with the high-speed clock of actual operation level or more even by means of the IC tester which is relatively low-priced and not capable of supplying the high-speed clock, and to achieve a method of testing the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 and 5 are timing charts showing test operations in accordance with the first preferred embodiment;

FIGS. 6 and 7 are timing charts showing test operations in accordance with the second preferred embodiment;

DESCRIPTION OF THE PREFERRED EMBODIMENTS

<The First Preferred Embodiment>

Figure 1:
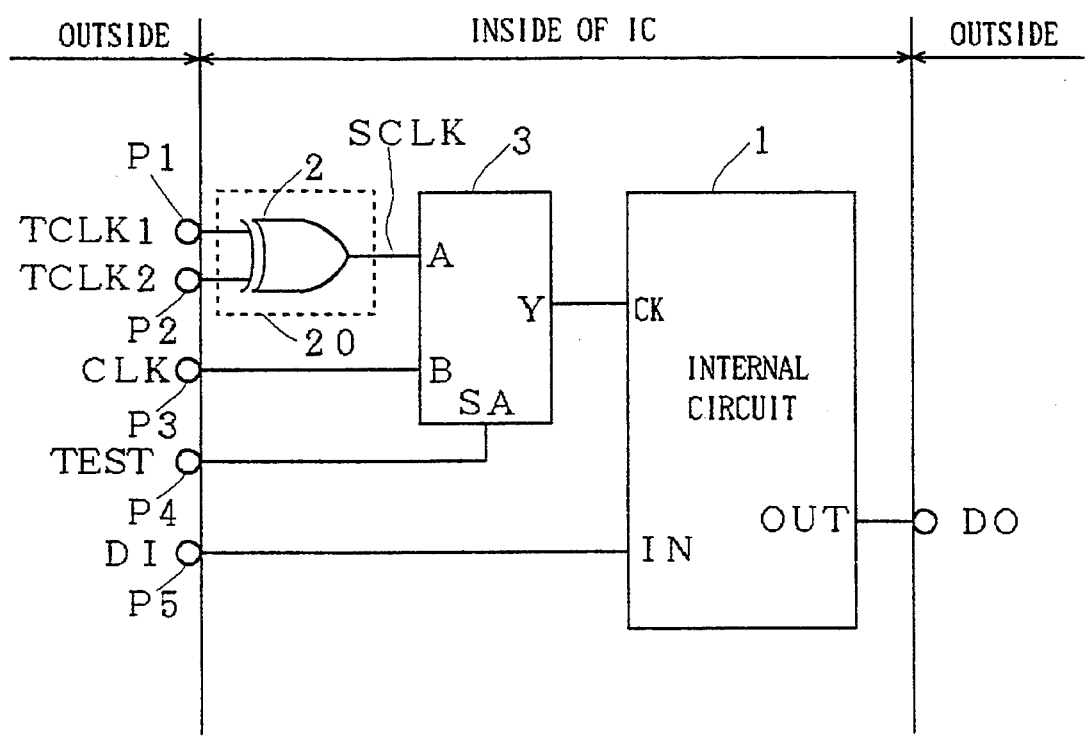
FIG. 1 is an explanatory diagram of an internal configuration of an IC employed in the first to fourth preferred embodiments in accordance with the present invention.

FIG. 1 is an explanatory diagram illustrating an internal configuration of an IC in accordance with the first preferred embodiment of the present invention. As shown in the figure, the IC consists of an internal circuit 1 for performing an actual operation, an exclusive OR gate 2 for generating a high-frequency clock and a selector 3 for making selection as to a clock input to the internal circuit 1.

The exclusive OR gate 2 receives the first test clock TCLK1 provided from the outside through the first test clock input pin P1 into the first input and receives the second test clock TCLK2 provided from the outside through the second test clock input pin P2 into the second input. Then, the exclusive OR gate 2 outputs a high-speed clock SCLK resulting from the test clocks to an A input of the selector 3. The exclusive OR gate 2 functions as a high-frequency conversion unit 20, as described later.

The selector 3 receives a normal clock CLK through a normal clock input pin P3 into a B input and receives a test mode signal TEST through a test mode input pin P4 into a select input SA. Depending on whether the test mode signal TEST is "H"/"L", the selector 3 selectively outputs the high-speed clock SCLK obtained from the A input/the normal clock CLK obtained from the B input to a clock input CK of the internal circuit 1 from a Y output as a selected clock.

That is, when the test mode signal TEST is "H" that indicates a state of test, the selector 3 selects the high-speed clock SCLK obtained from the A input to output from the Y output, on the other hand, when the test mode signal TEST is "L" that indicates a normal state, the selector 3 selects the normal clock CLK obtained from the B input to output from the Y output.

The internal circuit 1 receives input data D1 through a data input pin P5 into a data input IN, and operates in response to the input data D1 as a function of the signal obtained from the clock input CK as an operating clock to output output data DO from a data output OUT through a data output pin P6 to the outside.

In the case of normal operation of the IC configured as above, the test mode signal TEST of "L" that indicates the normal mode is applied to the test mode input pin P4 from the outside, whereby the selector 3 selects the normal clock CLK provided through the normal clock input pin P3 to be inputted to the clock input CK of the internal circuit 1.

Then, the internal circuit I operates in response to the input data D1 with the normal clock CLK used as the operating clock, to output the output data D1.

Figure 2:
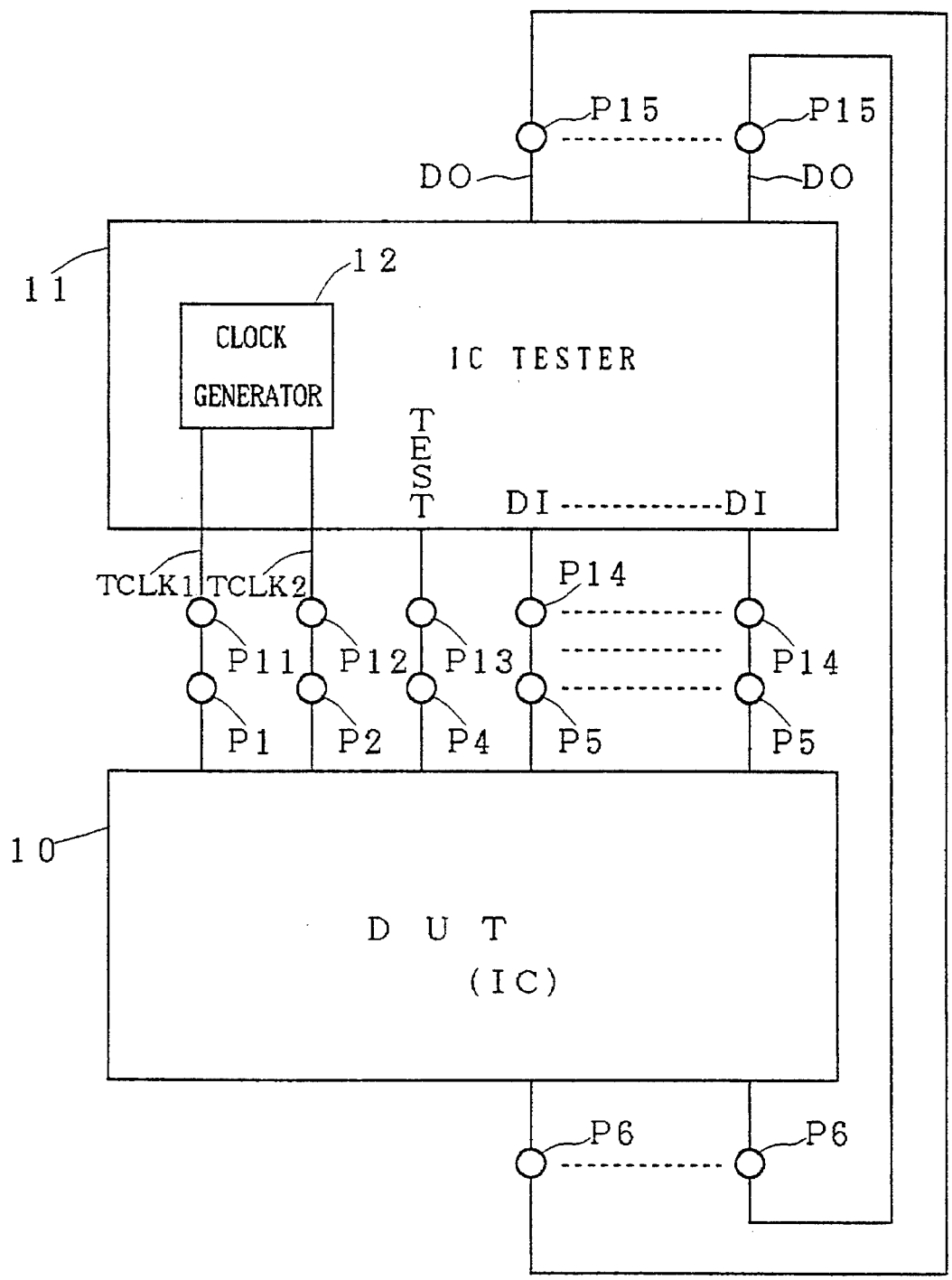
FIG. 2 is an explanatory diagram showing a connection between the IC (DUT) and an IC tester in performing a method of testing the IC in accordance with the first to third preferred embodiments of the present invention.

FIG. 2 is an explanatory diagram showing a method of the functional test of the IC as illustrated in FIG. 1. When the IC of FIG. 1 is employed as an IC to be tested (DUT), the DUT 10 and an IC tester 11 are connected as shown in FIG. 2. Detailed description of the IC tester 11 will be given below.

The IC tester 11 is capable of outputting the first test clock TCLK1 and the second test clock TCLK2 both provided by an internal clock generator 12 through the first clock output pin P11 and the second clock output pin P12, respectively. The two clocks consist of H-level and L-level and have the same test frequency and test duty and different test phases. The IC tester 11 also outputs the test mode signal TEST which is internally generated through a test mode output pin P13 and outputs a plurality of test input data D1 which are also internally generated through a plurality of test data output pins 14. Moreover, the IC tester 11 receives a plurality of output data DO outputted from the DUT 10 through a plurality of test data input pins 15 to judge the logical level of the output data DO. Thus, the IC tester carries out the operation test by checking the judgement result of the logical level of the output data DO in connection with the input data D1.

Next, detailed description of the connection between the IC tester 11 and the DUT 10 will be given below. As shown in FIG. 2, connections are made between the first test clock input pin P1 of the DUT 10 and the first clock output pin P11 of the IC tester 11, the second clock input pin P2 of the DUT 10 and the second clock output pin P12 of the IC tester 11, the test mode input pin P4 of the DUT 10 and the test mode output pin P13 of the IC tester 11, a plurality of data input pins P5 of the DUT 10 and a plurality of test data output pins P14 of the IC tester 11 respectively, and a plurality of output pins P6 of the DUT 10 and a plurality of test data input pins P15 of the IC tester 11, respectively.

Now, the method of functional test of the DUT 10 by means of the IC tester 11 will be described.

After completing the connection between the DUT 10 and the IC tester 11 as above, the test mode signal TEST of "H" indicating the test mode is applied to the test mode input pin P4 so that the high-speed clock SCLK outputted from the exclusive OR gate 2 may be inputted to the clock input CK of the internal circuit 1.

Following the above setting, as shown in FIG. 3, the first test clock TCLK1 and the second test clock TCLK2 are applied to the first test clock input pin P1 and the second test clock input pin P2, respectively (the first aspect).

The first test clock TCLK1 and the second test clock TCLK2 each have a cycle 2A, a test frequency f and a test duty 50%. The second test clock TCLK2 lags behind the first test clock TCLK1 by B (=A/4).

In this case, the high-speed clock SCLK outputted from the exclusive OR gate 2 has a cycle A and a frequency 2f, i.e., has a frequency twice higher than that of the first test clock TCLK1 or the second test clock TCLK2. A duty thereof is 25%.

In other words, the DUT 10 can internally generate the high-speed clock SCLK whose frequency is twice higher than that of the first test clock TCLK1 or the second test clock TCLK2 generated by the clock generator 12 of the IC tester 11 to apply the same to the clock input CK of the internal circuit 1.

The IC tester 11 applies the input data DI in sequence to the data input IN of the internal circuit 1 of the DUT 10 and thereby makes the DUT 10 output the output data DO. The IC tester 11 receives the output data DO through the test data input pins 15 to judge the signal level thereof, thus carrying out the functional test of the DUT 10.

As the result, it is possible to perform the functional test of the DUT 10 with the clock having higher frequency than (two times as high as) the clock supplied by the clock generator 12 of the IC tester 11. Accordingly, even if the DUT 10 is an IC of high-speed operation and the low-priced clock generator 12 of the IC tester 11 is employed, the functional test of the DUT 10 can be carried out by supplying an actual operating clock.

FIGS. 4 and 5 are explanatory diagrams respectively showing the second and third aspects of the first test clock TCLK1 and the second test clock TCLK2.

In the second aspect, as shown in FIG. 4, the first test clock TCLK1 and the second test clock TCLK2 each have a cycle 2A, a test frequency f and a test duty 50%. The second test clock TCLK2 lags behind the first test clock TCLK1 by B' (=A/2).

In this case, the high-speed clock SCLK outputted from the exclusive OR gate 2 has a cycle A and a frequency 2f, i.e., has a frequency twice higher than that of the first test clock TCLK1 or the second test clock TCLK2. A duty thereof is 50%.

In the third aspect, as shown in FIG. 5, the first test clock TCLK1 and the second test clock TCLK2 each have a cycle 2A, a test frequency f and a test duty 50%. The second test clock TCLK2 lags behind the first test clock TCLK1 by B" (=3A/4).

In this case, the high-speed clock SCLK outputted from the exclusive OR gate 2 has a cycle A and a frequency 2f, i.e., has a frequency twice higher than that of the first test clock TCLK1 or the second test clock TCLK2. A duty thereof is 75%.

As shown in the first to third aspects, it is possible to arbitrarily set the duty of the high-speed clock SCLK which is generated within the DUT 10 by varying the phase difference B between the first test clock TCLK1 and the second test clock TCLK2.

Since the clock generator 12 of the IC tester 11, even if a cheap one, can provide the phase difference between the first test clock TCLK1 and the second test clock TCLK2 with high precision, it is possible to precisely set the duty of the high-speed clock SCLK.

<The Second Preferred Embodiment>

FIGS. 6 and 7 are timing charts showing a method of testing the IC (DUT) in accordance with the second preferred embodiment of the present invention. The DUT to be tested by the method has the same internal configuration as the IC of FIG. 1. The IC tester 11 has the same configuration and connection with the DUT 10 as those of FIG. 2.

However, the operation of the DUT 10 is triggered by the leading edge and trailing edge of the high-speed clock SCLK. In other words, the output data DO changes every half cycle A/2 of the high-speed clock SCLK. In FIG. 6, the variation of the number with respect to the output data DO corresponds to the variation of the signal level of the output data DO.

On the other hand, the IC tester 11 can set the strobe point only every half clock cycle A of the test clock generated by the clock generator 12. The strobe point means a timing for judging the signal level of the output data DO obtained through the test data input pins P15.

That is, the strobe point of the IC tester 11 can not be set in correspondence with the variation of the output data DO of the DUT 10. In this case, in order to perform the functional test of the DUT 10 without any trouble, the functional test is carried out in the following two steps.

As shown in FIG. 6, by setting the strobe point (indicated by ↑ in the figure) in a period when the high-speed clock SCLK is "H", the output data DO outputted during the period of "H" is received through the test data input pin P15. That is, the output data DO 1, 3, 5, 7, 9 . . . shown in FIG. 6 may be received every period A as an output expectation waveform. Setting the strobe points like this, the first functional test is carried out in the same manner as the first preferred embodiment.

Next, as shown in FIG. 7, by setting the strobe point in a period when the high-speed clock SCLK is "L", the output data DO outputted during the period of "L" is received through the test data input pin P15. That is, the output data DO 2, 4, 6, 8, 10 . . . shown in FIG. 7 may be received every period A as an output expectation waveform. Setting the strobe points like this, the second functional test is carried out in the same manner as the first preferred embodiment.

Thus, even if the IC tester 11 whose strobe point can not be set in correspondence with the output variation of the DUT 10 is employed, by taking the two steps, the functional test can be carried out with the DUT in operation with the high-speed clock SCLK.

<The Third Preferred Embodiment>

Figures 8E, 8F, 8G:
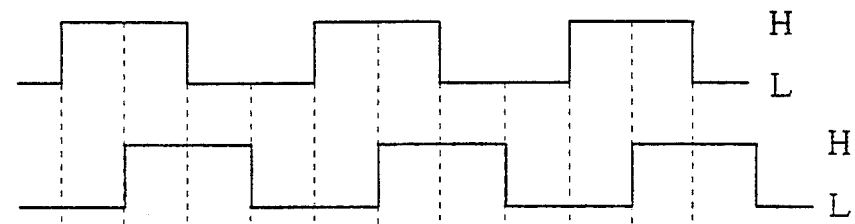
FIG. 8 is a timing chart showing a test operation in accordance with the third preferred embodiment.
Figure 9:
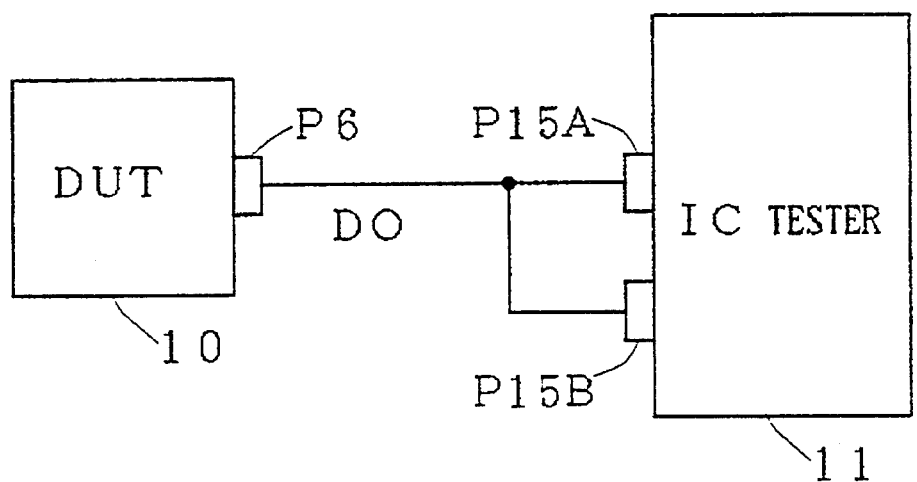
FIG. 9 is an explanatory diagram showing a connection between the IC (DUT) and an IC tester in performing the method of testing the IC in accordance with the third preferred embodiments of the present invention.

FIG. 8 is a timing chart showing a method of testing the IC (DUT) in accordance with the third preferred embodiment of the present invention. The DUT to be tested by the method has the same internal configuration as the IC of FIG. 1. The IC tester 11 has the same configuration and connection with the DUT 10 as those of FIG. 2. As can be seen in FIG. 9, there is a difference in that a data output pin P6 is connected to two test data input pins P15A and P15B.

The operation of the DUT 10 is triggered by the leading edge and trailing edge of the high-speed clock SCLK. The IC tester 11 can set the strobe point only every half clock cycle A of the test clock generated by the clock generator 12. The strobe point can be set independently every test data input pin P15 (P15A, P15B).

In the third preferred embodiment, as shown in FIG. 8, by setting the strobe point (indicated by ↑ in the figure) in a period when the high-speed clock SCLK is "H" at the test data input pin P15A, the output data DO outputted during the period of "H" is received through the test data input pin P15A. That is, the output data DO 1, 3, 5, 7, 9 . . . shown in FIG. 8 may be received every period A as an output expectation waveform of the test data input pin P15A. On the other hand, by setting the strobe point in a period when the high-speed clock SCLK is "L" at the test data input pin P15B, the output data DO outputted during the period of "L" is received through the test data input pin P15. That is, the output data DO 2, 4, 6, 8, 10 . . . shown in FIG. 8 may be received every period A as an output expectation waveform of the test data input pin P15B. Setting the strobe points like this, the functional test is carried out in the same manner as the first preferred embodiment.

Thus, by connecting the data input pin P5 of the DUT 10 to two test data input pins P15A and P15B and setting the strobe points of the pins P15A and P15B to separate timings, it is possible to carry out the functional test with the DUT 10 in operation with the high-speed clock SCLK only one time, even if the IC tester 11 whose strobe point can not be set in correspondence with the output variation of the DUT. Therefore, the time required to perform the functional test of the third embodiment is half as long as that of the second embodiment, so that reduction of test time can be achieved.

<The Fourth Preferred Embodiment>

Figure 10:
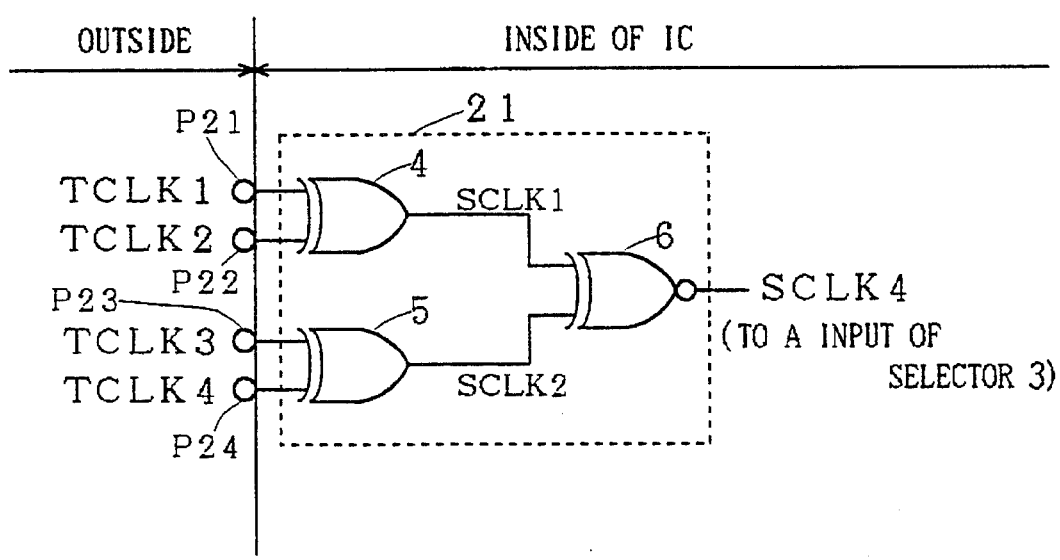
FIG. 10 is an explanatory diagram of a part of internal configuration of the IC employed in the fourth preferred embodiment in accordance with the present invention.

FIG. 10 is a circuit diagram showing a part of internal configuration of the IC in accordance with the fourth preferred embodiment of the present invention. The whole internal configuration of the IC of the fourth preferred embodiment is the same as that of the first preferred embodiment shown in FIG. 1. Now, description of the difference between the IC of FIG. 10 and the IC of FIG. 1 will be given below.

As can be seen in FIG. 10, a high-frequency conversion unit 21 is provided in place of the high-frequency conversion unit 20 of FIG. 1. The high-frequency conversion unit 21 consists of three exclusive OR gates 4 to 6. The exclusive OR gate 4 receives the first test clock TCLK1 which is obtained from the outside (IC tester) through the first test clock input pin P21 into the first input and receives the second test clock TCLK2 which is obtained from the outside through the second test clock input pin P22 into the second input, to output a high-speed clock SCLK1 resulting from the test clocks to the first input of the exclusive OR gate 6. The exclusive OR gate 5 receives the third test clock TCLK3 which is obtained from the outside through the third test clock input pin P23 into the first input and receives the fourth test clock TCLK4 which is obtained from the outside through the fourth test clock input pin P24 into the second input, to output a high-speed clock SCLK2 resulting from the test clocks to the second input of the exclusive OR gate 6.

Then, an output of the exclusive OR gate 6 is outputted to the A input of the selector 3 as a high-speed clock SCLK3.

In the IC configured as above, during the test mode, when the first to fourth test clocks TCLK1~TCLK4 which have the same test frequency and test duty and different phases are applied to the first to fourth test clock input pins P21~P24, each of the test frequencies of the first to fourth test clocks TCLK1~TCLK4 doubles at the exclusive OR gates 4 and 5, and further doubles at the exclusive OR gate 6, to be outputted as a high-speed clock SCLK4 to the A input of the selector 3. Furthermore, it is necessary that the phase difference between the first test clock TCLK1 and the second test clock TCLK2 should be the same as the phase difference between the third test clock TCLK3 and the fourth test clock TCLK4.

As the result, the functional test of the DUT 10 can be carried out with the high-speed clock having a frequency four times as high as the test frequency provided by the clock generator of the IC tester.

In the first embodiment, it is shown that the high-frequency conversion unit 20 generates the frequency twice as high as that of the test clock provided by the clock generator of the IC tester, while in the fourth embodiment, it is shown that the high-frequency conversion unit 21 generates the frequency four times as high as that of the test clock provided by the clock generator of the IC tester. Not limited to these, however, the frequency k times (k is a natural number) as high as that of the test clock can be generated within the IC by modifying the high-frequency conversion unit 20 (21) in combination of exclusive OR gates.

<Others 1>

Although description of functional tests of the IC was given in the first to third embodiments, the present invention is applicable to a dynamic burn-in of the IC.

That is, stress is applied to the IC of high-speed operation shown in FIG. 1 under severer condition than that in actual operation. Then, in the same manner as in the functional test of the first embodiment, clock signals having the same frequency and duty and different phases are inputted by means of an IC driving device for burn-in to the first test clock input pin P1 and the second test clock input pin P2 respectively, and thereafter the test frequency of the clock signals are raised within the IC, whereby the dynamic burn-in can be performed with the IC in high-speed operation with clocks having frequency of actual operation level or more, even if a low-priced IC driving device for burn-in whose test frequency is low is employed.

<Others 2>

Although the high-frequency conversion units 20 and 21 are provided within the IC in the first and fourth embodiments, there may be a case where a high-frequency conversion unit is provided within the IC tester.

For example, in the configuration of FIG. 1, the exclusive OR gate receives two clocks outputted from the clock generator 12 within the IC tester 11, and an output from the exclusive OR gate may be employed as an output clock. In this case, by providing a circuit which corresponds to the selector 3 within the IC tester 11 as required, selection can be made as to whether the output clock from the clock generator 12 is outputted to the outside through the exclusive OR gate or not through.

While the invention has been shown and described in detail, the foregoing description is in all aspects illustrative and not restrictive. It is therefore understood that numerous modifications and variations can be devised without depart-

We claim:

1. A semiconductor integrated circuit, comprising:

first to n-th (integer n≧2) test clock input terminals for receiving first to n-th clocks from outside said circuit respectively which have the same test frequency and test waveform and different test phases;

a normal clock input terminal for receiving a normal clock independent of said n clocks from outside said circuit;

a test mode input terminal for receiving a test mode signal from outside said circuit;

a data input terminal for receiving input data;

a data output terminal;

a high-frequency conversion means for receiving said first to n-th test clocks obtained through said first to n-th test clock input terminals into first to n-th inputs respectively, to output a high-speed clock having a higher frequency than said test frequency as a function of each of phase differences of said first to n-th test clocks;

a selection means for receiving said high-speed clock into a first input, receiving said a normal clock obtained through said normal clock input terminal into a second input and receiving said test mode signal into a third input, to output either said high-speed clock or said normal clock as a selected clock according to said test mode signal; and an internal circuit for receiving said selected clock and said input data obtained through said data input terminal and then operating with said selected clock used as an operating clock to output output data to the outside through said data output terminal.

2. The semiconductor interacted circuit of claim 1, wherein said integer n is 2;

said first and second (n=2) test clocks are signals each consisting of high-level and low-level and having the same duty; and said high-frequency conversion means comprises an exclusive OR gate whose first input is connected to said first test clock input terminal and second input is connected to said second test clock input terminal.

3. The semiconductor interacted circuit of claim 1, wherein said integer n is 4;

said first to n-th (n=4) test clocks are signals each of which consists of high-level and low-level and has the same duty, in which a phase difference between said first test clock and said second test clock is the same as a phase difference between said third test clock and said fourth test clock;

said high-frequency conversion means comprises a first exclusive OR gate whose first input is connected to said first test clock input terminal and second input is connected to said second test clock input terminal;

a second exclusive OR gate whose first input is connected to said third test clock input terminal and fourth input is connected to said fourth test clock input terminal;

a third exclusive OR gate whose first input is connected to an output of said first exclusive OR gate and second input is connected to an output of said second exclusive OR gate.

4. A method of testing a semiconductor integrated circuit by means of an IC tester, wherein said semiconductor integrated circuit includes first to n-th (integer n≧2) test clock input terminals for receiving first to n-th test clock from outside said circuit respectively which have the same test frequency and test waveform and different test phases and further including a normal clock input terminal for receiving a normal clock, independent of said n test clocks, from outside said circuit, a test mode input terminal for receiving a test mode signal from outside said circuit, a data input terminal for receiving input data, a data output terminal, a high frequency conversion means for receiving the first to n-th test clocks through the first to n-th test clock input terminals into first to n-th inputs respectively, to output a high speed clock having a higher frequency than said test frequency as a function of each of phase differences of the first to n-th test clocks, said integrated circuit also having a selection means for receiving the high-speed clock into a first input, receiving the normal clock obtained through the normal clock input terminal into a second input and receiving the test mode signal into a third input, to output ether the high-speed clock or the normal clock as a selected clock according to the test mode signal and an internal circuit for receiving the selected clock and the input data obtained through the data input terminal and then operating with the selected clock used as an operating clock to output data to the outside through the data output terminal, and wherein said IC tester includes first to n-th clock terminals for outputting the first to n-th test clocks having the same frequency and waveform and different phases, a test mode output terminal for outputting the test mode signal, a test data output terminal for outputting the input data, and a test data input terminal for inputting the output data, and wherein the IC tester is capable of performing an operation test by judging the logical level of said output data, said method comprising the steps of:

(a) connecting said semiconductor integrated circuit and said IC tester through connections between said first to n-th test clock input terminals and said first to n-th clock output terminals respectively, between said test mode input terminal and said test data output terminal and between said data output terminal and said test data input terminal;

(b) outputting said test mode signal indicating selection of said high-speed clock from said IC tester;

(c) outputting said first to n-th clocks from said IC tester; and (d) performing an operation test of said semiconductor integrated circuit by outputting said input data from said IC tester in sequence and then judging the signal level of said output data obtained from said semiconductor integrated circuit.

5. The method of testing a semiconductor integrated circuit of claim 4, wherein said integer n is 2;

said first and second (n=2) test clocks are signals each consisting of high-level and low-level and having the same duty; and said high-frequency conversion means comprises an exclusive OR gate whose first input is connected to said first test clock input terminal and second input is connected to said second test clock input terminal.

6. The method of testing a semiconductor integrated circuit of claim 5, wherein said semiconductor interacted circuit has variation of said output data in response to every change of edges of said high-speed clock;

said IC tester judges the signal level of said output data every half cycle of said first and second test clocks; and in said method, a first test is performed by carrying out said steps of (b) to (d) after setting the judgment timing of said output data in one of a high-level period and a low-level period of said high-speed clock; and a second test is performed by carrying out said steps of (b) to (d) after setting the judgment timing of said output data in the other period of said high-speed clock.

7. The method of testing a semiconductor interacted circuit of claim 6, wherein said semiconductor interacted circuit has variation of said output data in response to every change of edges of said high-speed clock, said IC tester judges the signal level of said output data every half cycle of said first and second test clocks, said step (a) comprises the step of connecting first and second test data input terminals to said data output terminal in common, and said method further comprises the step of setting the judgement timing of said output data received by said first test data terminal in one of a high-level period and a low-level period of said high-speed clock while setting the judgement timing of said output data received by said second test data terminal in the other period of said high-speed clock, prior to performing said steps (b) to (d).

8. A method of testing a semiconductor integrated circuit driven by an IC driving means, wherein said semiconductor integrated circuit includes first to n-th (integer n≧2) test clock input terminals for receiving first to n-th test clocks from outside said circuit respectively which have the same test frequency and test waveform and different test phases, a normal clock input terminal for receiving a normal clock independent of said n test clocks and from outside said circuit, a test mode input terminal for receiving a test mode signal from outside said circuit, a data input terminal for receiving input data, a data output terminal, a high-frequency conversion means for receiving the first to n-th test clocks obtained through the first to n-th test clock input terminals into first to n-th inputs respectively, to output a high-speed clock having a higher frequency than the test frequency as a function of each of phase differences of the first to n-th test clocks, said integrated circuit further having a selection means for receiving said high-speed clock into a first input, receiving said a normal clock obtained through the normal clock input terminal into a second input and receiving the test mode signal into a third input, to output either the high-speed clock or said normal clock as a selected clock according to the test mode signal, and an internal circuit for receiving the selected clock and the input data obtained through the data input terminal and then operating with the selected clock used as an operating clock to output output data to the outside through the data output terminal, and wherein said IC driving means includes first to n-th clock terminals for outputting the first to n-th test clocks having the same frequency and waveform and different phases a test mode output terminal for outputting the test mode signal, a test data output terminal for outputting said input data;

said method comprising the steps of:

(a) connecting said semiconductor integrated circuit and said IC driving means through connections between said first to n-th test clock input terminals and said first to n-th clock output terminals respectively, between said test mode input terminal and said test data output terminal and between said data output terminal and said test data input terminal;

(b) outputting said test mode signal indicating selection of said high-speed clock from said IC driving means;

(c) outputting said first to n-th clocks from said IC driving means; and (d) outputting said input data in sequence from said IC driving means, and wherein said steps of (b) to (d) are carried out under severer condition than that in actual operation of said semiconductor integrated circuit.

* * * * *